(12) United States Patent
Ohtomo et al.

(10) Patent No.: US 8,097,849 B2
(45) Date of Patent: Jan. 17, 2012

(54) ELECTRON MICROSCOPE DEVICE

(75) Inventors: Fumio Ohtomo, Tokyo-to (JP); Hisashi Isozaki, Tokyo-to (JP)

(73) Assignee: Kabushiki Kaisha TOPCON, Tokyo-to (JP)

( * ) Notice: Subject to any disclaimer, the term of this patent is extended or adjusted under 35 U.S.C. 154(b) by 227 days.

(21) Appl. No.: 12/653,324

(22) Filed: Dec. 11, 2009

(65) Prior Publication Data

US 2010/0163728 A1 Jul. 1, 2010

(30) Foreign Application Priority Data

Dec. 26, 2008 (JP) .................................. 2008-334063

(51) Int. Cl.
*H01J 37/28* (2006.01)
(52) U.S. Cl. ........................................................ 250/310
(58) Field of Classification Search .................. 250/310; 359/369
See application file for complete search history.

(56) References Cited

U.S. PATENT DOCUMENTS

| | | | |
|---|---|---|---|
| 5,399,869 A | | 3/1995 | Usuda |
| 6,031,230 A | * | 2/2000 | Toumatsu ..................... 250/310 |
| 7,157,703 B2 | | 1/2007 | Nakasuji et al. |
| 2009/0002695 A1 | | 1/2009 | Saito et al. |
| 2010/0091362 A1 | * | 4/2010 | Isozaki et al. ................. 359/369 |
| 2010/0163729 A1 | | 7/2010 | Isozaki |

FOREIGN PATENT DOCUMENTS

| | | |
|---|---|---|
| JP | 04-280053 | 10/1992 |
| JP | 2010-157393 A | 7/2010 |

OTHER PUBLICATIONS

Office Action mailed Sep. 21, 2011 in co-pending U.S. Appl. No. 12/653,366.

\* cited by examiner

*Primary Examiner* — Kiet Nguyen
(74) *Attorney, Agent, or Firm* — Nields, Lemack & Frame, LLC

(57) ABSTRACT

The present invention provides an electron microscope device 1, comprising a scanning electron microscope 2 and an optical microscope 3, wherein the scanning electron microscope has scanning means 10 for scanning an electron beam and an electron detector 12 for detecting electrons issued from a specimen 8 scanned by the electron beam, and the scanning electron microscope acquires a scanning electron image based on a detection result from the electron detector, wherein the optical microscope projects an illumination light to the specimen, receives a reflection light from the specimen and acquires an optical image, and wherein an optical axis 7 of the scanning electron microscope crosses an optical axis 6 of the optical microscope at a point of observation of the specimen, wherein the scanning means projects the electron beam for scanning with a scanning width wider than a width of a scanning area, the optical microscope projects an illumination light and acquires an optical image in an overrunning portion where the electron beam is projected beyond the scanning area, and the scanning electron microscope acquires a scanning electron image based on electrons issued when the electron beam scans over the scanning area.

6 Claims, 4 Drawing Sheets

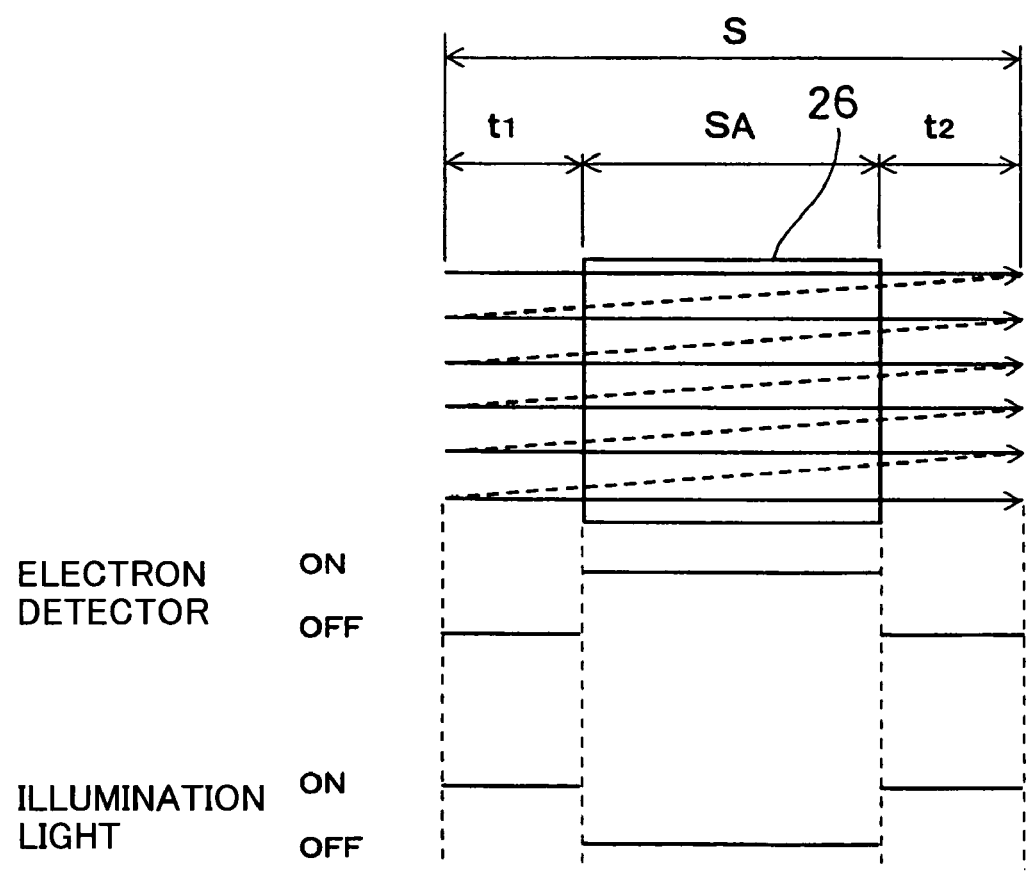

EFFECTIVE SCANNING WIDTH SA

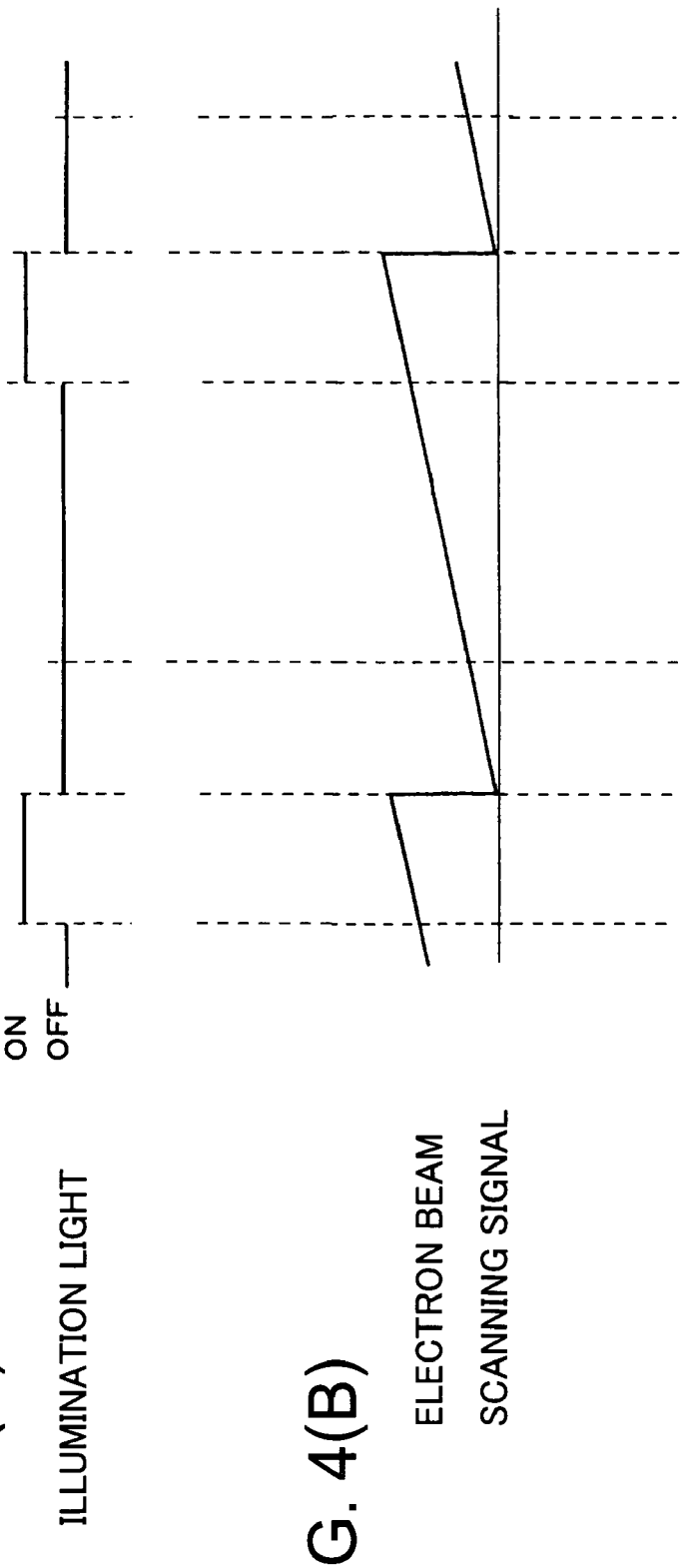
FIG. 4(A) ILLUMINATION LIGHT
FIG. 4(B) ELECTRON BEAM SCANNING SIGNAL
FIG. 4(C) ELECTRON DETECTOR DETECTION SIGNAL

ELECTRON MICROSCOPE DEVICE

BACKGROUND OF THE INVENTION

The present invention relates to an electron microscope device, by which it is possible to observe a scanning electron image and an optical image of a specimen. In particular, the present invention relates to an electron microscope device, by which an optical image can be observed at the same time during electron scanning action.

A scanning electron microscope (SEM) is so designed that an electron beam is projected for scanning over a specimen, and the electron issued by the projection of the electron beam is detected. Then, a scanning electron image is acquired on detailed status of a surface of the specimen.

On the other hand, a field angle of the electron beam is very small, and it is very difficult to project the electron beam to a specific position unless a projecting position is identified and recognized in advance.

For this reason, an electron microscope device is provided with an optical microscope, which has magnification lower than magnification of the electron microscope. First, an illumination light (white light) is projected to the specimen, and the specimen is observed by means of the optical microscope, and a projected position is specified. Then, by changing over to the electron microscope, the electron beam is projected to scan over the projected position of the specimen and the specimen is observed.

In case it is wanted to obtain a scanning electron image, electrons emitted from the specimen enter to a fluorescent substance. A light emitted from the fluorescent substance is converted to an electric signal by a photoelectric conversion element, and a scanning electron image is acquired based on this electric signal. In case an optical image is acquired by using an optical microscope, a light reflected from the specimen is received by a photoelectric element for the optical microscope and the detection result is converted to an electric signal, and an optical image is acquired based on this electric signal.

However, a level of energy is extremely different between electrons acquired by scanning of the electron beam and a light reflected from the specimen. When a reflection light from the specimen enters the photoelectric element, which is detecting the electron beam, the photoelectric element is saturated or S/N is extremely low, and the electron beam cannot be detected.

Therefore, it has been practiced in the past that the optical microscope and the electron microscope are changed properly between a case where the optical microscope is used for observation and a case where the electron microscope is used, and it is so arranged that the electron microscope is not used for observation when it is observed by the optical microscope and that the optical microscope is not used for observation of the specimen when it is observed by electron microscope.

For instance, the optical microscope and the electron microscope are separated from each other, and an optical axis of the optical microscope and an optical axis of the electron microscope are set in a known specific relationship. When a table on which the specimen is placed is moved between the optical microscope and the electron microscope, a position to observe an optical image is associated with a position to observe a scanning electron image.

Therefore, there arises a problem in a conventional type electron microscope that the structure is very complicated and the scanning electron image and the optical image cannot be observed at the same time.

An electron microscope, by which the scanning electron image and the optical image can be observed at the same time, is disclosed in JP-A-4-280053.

In the electron microscope described in JP-A-4-280053, an optical system of the electron microscope and an optical system of the optical microscope have the same optical axis. An illumination light and an electron beam are projected at the same time. In the signals from the electron detector, signals of the illumination light are removed as DC components, and signals containing only electrons are extracted.

However, the DC components of the illumination light are extremely in higher amount compared with signal components, and it is very difficult to attain the purpose.

SUMMARY OF THE INVENTION

It is an object of the present invention to provide an electron microscope device, which can observe a scanning electron image and an optical image at the same time and has simple construction.

To attain the above object, the present invention provides an electron microscope device, comprising a scanning electron microscope and an optical microscope, wherein the scanning electron microscope has scanning means for scanning an electron beam and an electron detector for detecting electrons issued from a specimen scanned by the electron beam, and the scanning electron microscope acquires a scanning electron image based on a detection result from the electron detector, wherein the optical microscope projects an illumination light to the specimen, receives a reflection light from the specimen and acquires an optical image, and wherein an optical axis of the scanning electron microscope crosses an optical axis of the optical microscope at a point of observation of the specimen, wherein the scanning means projects the electron beam for scanning with a scanning width wider than a width of a scanning area, the optical microscope projects an illumination light and acquires an optical image in an overrunning portion where the electron beam is projected beyond the scanning area, and the scanning electron microscope acquires a scanning electron image based on electrons issued when the electron beam scans over the scanning area.

Also, the present invention provides the electron microscope device as described above, wherein the scanning electron microscope sets the electron detector to an inactive status in the overrunning portion and also sets the electron detector to an active status when the electron beam is projected to scan over the scanning area, the optical microscope projects the illumination light in the overrunning portion of the electron beam and said illumination light is turned off when the electron beam is projected to scan over the scanning area.

Further, the present invention provides the electron microscope device as described above, wherein the optical microscope turns on the illumination light at the moment when the projection of the light to the overrunning portion is started, and turns off the illumination light before the projection of the light to the overrunning portion is finished. Also, the present invention provides the electron microscope device as described above, wherein the turning-on operation of the illumination light and the overrunning portion are in such a relationship that discharge of the electron detector is completed before the projection of the light to the overrunning portion is finished after the electron detector receives the illumination light. Further, the present invention provides the electron microscope device as described above, wherein the overrunning portion of the light can be changed in the scanning electron microscope. Also, the present invention provides the electron microscope device as described above, wherein the overrunning portion of the light is made up with a scanning finishing portion of the electron beam and with a scanning starting portion subsequent to the scanning finishing portion.

The present invention provides an electron microscope device, comprising a scanning electron microscope and an optical microscope, wherein the scanning electron microscope has scanning means for scanning an electron beam and an electron detector for detecting electrons issued from a specimen scanned by the electron beam, and the scanning electron microscope acquires a scanning electron image based on a detection result from the electron detector, wherein the optical microscope projects an illumination light to the specimen, receives a reflection light from the specimen and acquires an optical image, and wherein an optical axis of the scanning electron microscope crosses an optical axis of the optical microscope at a point of observation of the specimen, wherein the scanning means projects the electron beam for scanning with a scanning width wider than a width of a scanning area, the optical microscope projects an illumination light and acquires an optical image in an overrunning portion where the electron beam is projected beyond the scanning area, and the scanning electron microscope acquires a scanning electron image based on electrons issued when the electron beam scans over the scanning area. As a result, in a process where the electron beam is projected for scanning, time sharing is carried out between acquisition of the optical image by projecting the illumination light and acquisition of the scanning electron image by scanning the electron beam, and it is possible to perform observation at the same time without giving influence on each other. Also, there is no need to mechanically separate the acquisition of the scanning electron image by the scanning electron microscope from the acquisition of the optical image by the optical microscope, and it is possible to attain the designing with simple construction.

Also, the present invention provides the electron microscope device as described above, wherein the scanning electron microscope sets the electron detector to an inactive status in the overrunning portion and also sets the electron detector to an active status when the electron beam is projected to scan over the scanning area, the optical microscope projects the illumination light in the overrunning portion of the electron beam and said illumination light is turned off when the electron beam is projected to scan over the scanning area. As a result, it is possible to carry out the control in easy and simple manner because electric power can be turned on and off in synchronization with the scanning operation.

BRIEF DESCRIPTION OF THE DRAWINGS

FIG. 2 is a drawing to explain a basic principle of a first embodiment of the present invention;

FIG. 4 is a drawing to explain a basic principle of the second embodiment of the present invention.

DETAILED DESCRIPTION OF THE PREFERRED EMBODIMENTS

Description will be given below on the best aspect for carrying out the present invention by referring to the attached drawings.

Figure 1:
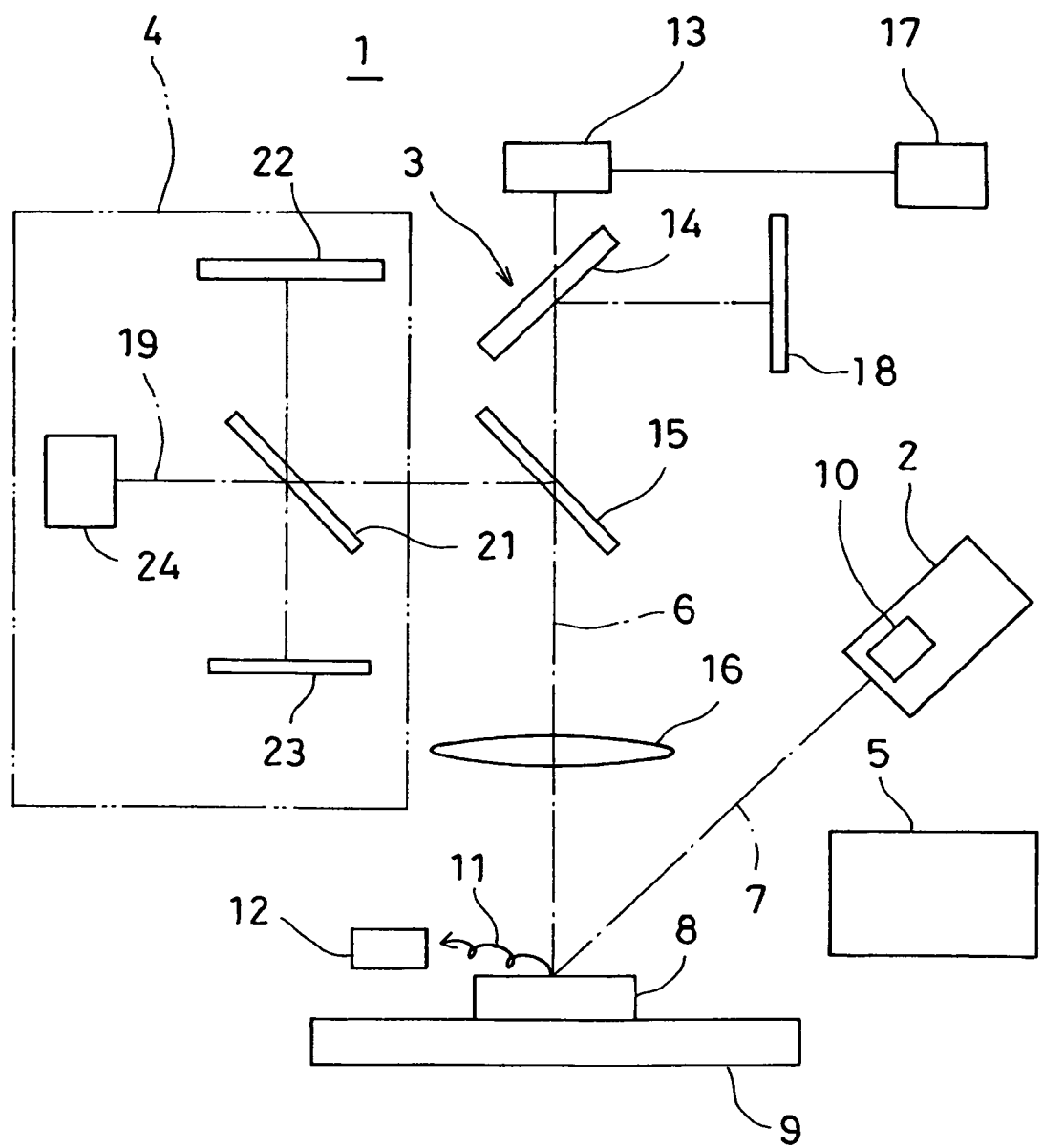
FIG. 1 is a schematical drawing to show approximate arrangement of an electron microscope device, to which the present invention is applied.

First, referring to FIG. 1, description will be given on general features of an electron microscope device 1 in the present invention.

The electron microscope device 1 comprises a scanning electron microscope 2, an optical microscope 3, an interferometer 4, and a control unit 5 for controlling operation of the scanning electron microscope 2, the optical microscope 3, and the interferometer 4. An object to be measured (specimen) 8 is placed at a point where an optical axis 6 of the optical microscope 3 crosses an optical axis 7 of, the scanning electron microscope 2, and the object to be measured 8 is placed on an inspection stage 9, which is movable along two directions of X-Y to perpendicularly cross the optical axis 6.

The optical axis 7 of the scanning electron microscope 2 is tilted at a predetermined angle (e.g. 60°) to the optical axis 6 of the optical microscope 3, and a point where the optical axis 6 and the optical axis 7 cross each other is a point where the object to be measured 8 is observed. An electron beam is projected to the object to be measured 8 along the optical axis 7, and the electron beam is projected for scanning over a predetermined range by an electron beam scanning means 10. By the electron beam being projected for scanning, an electron 11 emitted from the object to be measured 8 is detected by an electron detector 12. The inspection stage 9 is moved in two directions of X-Y in synchronization with the projection of the electron beam, and the electron beam scans over the predetermined range of the object to be measured 8.

The result of detection by the electron detector 12 is sent to the control unit 5. Based on the result of detection, a scanning electron image is prepared at the control unit 5.

Along the optical axis 6, there are arranged an LED 13 for emitting an illumination light (white light), a first half-mirror 14, a second half-mirror 15, and an objective lens 16, and emission of the light of the LED 13 is controlled by a light emission drive unit 17. An illumination light emitted from the LED 13 passes through the first half-mirror 14, the second half-mirror 15 and the objective lens 16, and the illumination light is then projected toward the object to be measured 8. After being reflected by the object to be measured 8, the illumination light passes through the second half-mirror 15. Then, the illumination light is reflected by the first half-mirror 14 and is received by a CCD for observation 18.

The interferometer 4 has an optical axis 19. The optical axis 19 is deflected by the second half-mirror 15 and reaches the object to be measured 8. On the optical axis 19, a third half-mirror 21 is disposed. The third half-mirror 21 is disposed between a CCD for measurement 22 and a reference mirror 23. The CCD for measurement 22 is disposed on one side of the third half-mirror 21 and the reference mirror 23 is disposed on the other side of the third half-mirror 21.

From the light source for measurement 24, a single wavelength light for measuring a distance is projected along the optical axis 19. A part of the single wavelength light passes through the third half-mirror 21 and then reflected by the second half-mirror 15 and is projected toward the object to be measured 8 via the objective lens 16. After being reflected by the object to be measured 8, the single wavelength light passes through the second half-mirror 15 and the third half-mirror 21 and is received by the CCD for measurement 22. After being reflected by the third half-mirror 21, the remaining part of the single wavelength light from the light source for measurement 24 is reflected by the reference mirror 23 and then, passes through the third half-mirror 21 and is received by the CCD for measurement 22. The CCD for measurement 22 receives the reflected light from the object to be measured 8 and the reflected light from the reference mirror 23. Based on an interference of the two reflection lights, a position in height direction of the object to be measured 8 is determined.

Then, a three-dimensional position information of the observation point is acquired from X-Y position of the observation point of the object to be measured 8 and a position in height direction as acquired by the interferometer 4.

In the scanning electron microscope 2, when the electron beam is projected for scanning over a predetermined scanning area by the electron beam scanning means 10, it is so designed that an actual scanning width is larger than a scanning area so that the electron beam overruns at a scanning starting portion and at a scanning finishing portion.

In the present embodiment, by using the scanning starting portion and the scanning finishing portion of the electron beam, lighting of the LED 13 is controlled so that the light from the LED 13 is projected in the scanning starting portion and the scanning finishing portion as a pulsed beam, and the LED 13 is turned off when the electron beam is scanning over the scanning area. As a result, a scanning electron image and an optical image can be observed at the same time.

Now, referring to FIG. 2, description will be given on a first embodiment of the present invention.

In FIG. 2, reference numeral 26 denotes a scanning area. A symbol S represents an actual scanning width of the electron beam, and a symbol SA denotes an effective scanning width.

By the control unit 5, the scanning area 26 is set. And the scanning width S and the effective scanning width SA of the scanning electron microscope 2 are also set. Electric power supply to the electron detector 12 is controlled by the control unit 5, and changeover control is carried out between an active (ON) status and an inactive (OFF) status of the electron detector 12. The turning-on and turning-off operations of the LED 13 are controlled in synchronization with the changeover control of the status of the electron detector 12.

To turn on or off the LED 13, the LED 13 is turned on when the electron detector 12 is turned off, and the LED 13 is turned off when the electron detector 12 is turned on.

As described above, if the LED 13 is turned on when the electron detector 12 is in the inactive status, the reflection light from the object to be measured 8 is received by the CCD for observation 18, and the optical image can be observed. When the scanning area 26 is scanned by the electron beam and the electron detector 12 is in the active status, the electron detector 12 detects only electrons because the LED 13 is turned off, and the electron detector 12 cannot be influenced by the illumination light. Therefore, the scanning electron image, which does not include noise caused by the illumination light, can be observed.

Further, optical images can be acquired for each scanning operation in the overrunning portion. As a result, optical image can be acquired during scanning operation, and a simultaneousness is ensured between the observation of the scanning electron image and the observation of the optical image. Specifically, there is no need to separate the scanning electron microscope 2 from the optical microscope 3 in terms of structure. For the purpose of the observation of the scanning electron image and the optical image, the scanning electron microscope 2 and the optical microscope 3 need not be separated from each other.

Next referring to FIG. 3, description will be given on a second embodiment of the present invention.

In the second embodiment, ON/OFF control of the electron detector 12 is not carried out.

Figure 3A:
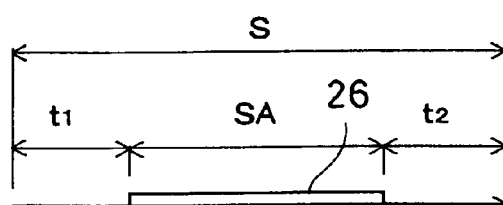
FIG. 3 is a drawing to explain a basic principle of the second embodiment of the present invention.
Figure 3B:
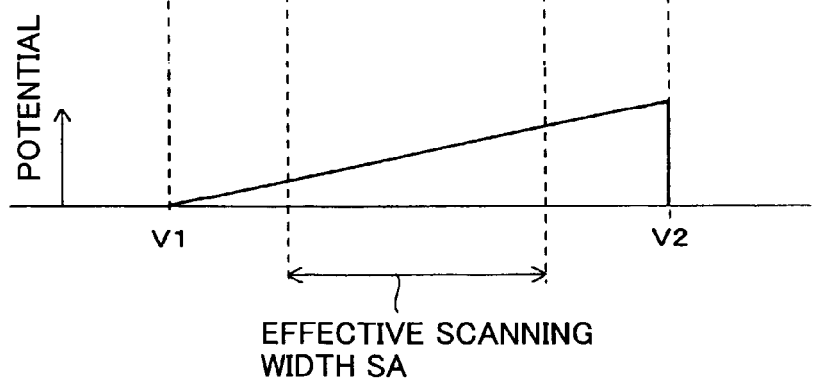

Similarly to the case of FIG. 2, FIG. 3 (A) shows relationship between the scanning area 26 on one hand and the actual scanning width S and the effective scanning width SA of electron beam on the other hand. FIG. 3 (B) shows a potential applied on the electron beam for projecting the electron beam for scanning. A potential V1 is applied on the scanning starting point, and a potential V2 is applied on the scanning finishing point.

If the scanning of electron beam and the applied voltage are shown in time series, it is in saw-tooth waveform (serrated waveform) as shown in FIG. 4 (B). If it is supposed that both end portions of the scanning width S are the overrunning portions (t1, t2), signals from the electron detector 12 do not contribute to the preparation of the scanning electron image with respect to the overrunning portion (t3=t1+t2) at both ends. Accordingly, even when the LED 13 is turned on at the overrunning portion and the object to be measured 8 is illuminated and a reflection light from the object to be measured 8 is inputted to the electron detector 12, no influence is exerted on the preparation of the scanning electron image. By turning on the LED 13, the reflection light from the objects to be measured 8 enters the CCD for observation 18, and an optical image can be acquired.

Therefore, if the LED 13 is turned on at the overrunning portion in synchronization with the scanning of the electron beam, the scanning electron image and the optical image can be acquired simultaneously as in the case of the first embodiment.

FIG. 4 (C) shows an output signal of the electron detector 12 when the illumination light enters the electron detector 12. As shown in the figure, the electron detector 12 has characteristics that when the light enters, a response occurs quickly, while the accumulated electric charge is discharged at slow speed. Therefore, by adjusting the term to turn on the LED 13 to match the scanning finishing portion (t2), discharge occurs at the scanning starting portion (t1) subsequent to the scanning finishing portion, and no adverse influence is exerted when the illumination light enters the electron detector 12.

That is to say, noise of the illumination light is not included in a signal, which is acquired at the effective scanning width SA.

Accordingly, the overrunning portion may be adjusted so that the influence of electric discharge of the electron detector 12 is not remain on the effective scanning width SA, and due consideration is given on the characteristics of the electron detector 12. The overrunning portions (t1, t2) can be changed by the control unit 5.

A laser beam is also emitted from the light source for measurement 24 of the interferometer 4. This laser beam may be set to have such a wavelength which is not sensed by the electron detector 12. Even when the interferometer 4 is operated, there will be no inconvenience or trouble in acquiring the scanning electron image.

As described above, there is no need to mechanically separate the scanning electron microscope 2 and the optical microscope 3 from each other. As a result, it is possible to have a device with simple structure and to observe the scanning electron image and the optical image at the same time.

In the embodiments as described, an LED is used as an illumination light source for observation, while a flashing light source such as a xenon lamp may also be used.

The invention claimed is:

1. An electron microscope device, comprising a scanning electron microscope and an optical microscope, wherein said scanning electron microscope has scanning means for scanning an electron beam and an electron detector for detecting electrons issued from a specimen scanned by the electron beam, and said scanning electron microscope acquires a scanning electron image based on a detection result from said electron detector, wherein said optical microscope projects an illumination light to the specimen, receives a reflection light from said specimen and acquires an optical image, and wherein an optical axis of said scanning electron microscope crosses an optical axis of said optical microscope at a point of observation of said specimen,
wherein said scanning means projects said electron beam for scanning with a scanning width wider than a width of a scanning area, said optical microscope projects an illumination light and acquires an optical image in an overrunning portion where said electron beam is projected beyond said scanning area, and said scanning electron microscope acquires a scanning electron image based on electrons issued when said electron beam scans over said scanning area.

2. The electron microscope device according to claim 1, wherein said scanning electron microscope sets said electron detector to an inactive status in said overrunning portion and also sets said electron detector to an active status when said electron beam is projected to scan over said scanning area, said optical microscope projects said illumination light in said overrunning portion of said electron beam and said illumination light is turned off when the electron beam is projected to scan over said scanning area.

3. The electron microscope device according to claim 1, wherein said optical microscope turns on said illumination light at the moment when the projection of the light to said overrunning portion is started, and turns off said illumination light before the projection of the light to said overrunning portion is finished.

4. The electron microscope device according to claim 3, wherein said turning-on operation of said illumination light and said overrunning portion are in such a relationship that discharge of said electron detector is completed before the projection of the light to said overrunning portion is finished after said electron detector receives said illumination light.

5. The electron microscope device according to claim 1, wherein said overrunning portion of the light can be changed in said scanning electron microscope.

6. The electron microscope device according to one of claims 1 to 3, wherein said overrunning portion of the light is made up with a scanning finishing portion of said electron beam and with a scanning starting portion subsequent to said scanning finishing portion.

* * * * *